(12) United States Patent
Liu

(10) Patent No.: US 10,942,231 B2
(45) Date of Patent: Mar. 9, 2021

(54) TRANSMIT/RECEIVE RADIO FREQUENCY (RF) SYSTEM FOR A MAGNETIC RESONANCE EXAMINATION SYSTEM AND METHOD THEREOF

(71) Applicant: KONINKLIJKE PHILIPS N.V., Eindhoven (NL)

(72) Inventor: Yong Liu, Shanghai (CN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/327,882

(22) PCT Filed: Aug. 17, 2017

(86) PCT No.: PCT/EP2017/070889
§ 371 (c)(1),
(2) Date: Feb. 25, 2019

(87) PCT Pub. No.: WO2018/041643
PCT Pub. Date: Mar. 8, 2018

(65) Prior Publication Data
US 2019/0195970 A1    Jun. 27, 2019

(30) Foreign Application Priority Data
Aug. 30, 2016 (WO) ................ PCT/CN2016/097295
Oct. 27, 2016 (EP) ..................................... 16196001

(51) Int. Cl.
*G01R 33/28* (2006.01)
*G01R 33/36* (2006.01)
*G01R 27/28* (2006.01)

(52) U.S. Cl.
CPC ............ *G01R 33/288* (2013.01); *G01R 27/28* (2013.01); *G01R 33/36* (2013.01); *G01R 33/3614* (2013.01)

(58) Field of Classification Search
CPC ...... G01R 27/28; G01R 33/288; G01R 33/36; G01R 33/3614
See application file for complete search history.

(56) References Cited

U.S. PATENT DOCUMENTS

| | | | | |
|---|---|---|---|---|
| 4,962,359 A | * | 10/1990 | Dunsmore | ............. G01R 27/28 324/637 |
| 7,966,140 B1 | | 6/2011 | Gholson et al. | |

(Continued)

*Primary Examiner* — Steven L Yeninas

(57) ABSTRACT

A transmit/receive RF system for a magnetic resonance examination system is described. The transmit/receive RF system comprises an RF antenna, an RF power amplifier configured to supply electrical RF power to the RF antenna, a coupling device coupled between the RF power amplifier and the RF antenna and configured to couple out fractions of a reflected power flowing from the RF antenna toward the RF power amplifier and a forward power flowing from the RF power amplifier toward the RF antenna to output a first coupled signal $V_{REV}$ and a second coupled signal $V_{FWD}$, a wave detector coupled to the coupling device and configured to detect amplitude and phase information of the first coupled signal $V_{REV}$ and the second coupled signal $V_{FWD}$, and a parameter calculator coupled to the wave detector and configured to calculate an operational parameter of the RF power amplifier based on complex scattering parameters of the coupling device and the detected amplitude and phase information of the first coupled signal $V_{REV}$ and second coupled signal $V_{FWD}$.

19 Claims, 4 Drawing Sheets

(56) References Cited

U.S. PATENT DOCUMENTS

| | | |
|---|---|---|
| 8,248,075 B2 | 8/2012 | Brannan et al. |
| 8,442,616 B2 | 5/2013 | Nistler et al. |
| 9,541,592 B1 * | 1/2017 | Tsironis ................. G01R 27/28 |
| 9,864,021 B1 * | 1/2018 | Habara ................. G01R 33/288 |
| 2010/0244840 A1 | 9/2010 | McKinnon |
| 2014/0266499 A1 | 9/2014 | Noe |
| 2015/0002147 A1 | 1/2015 | Fontius et al. |
| 2015/0081238 A1 | 3/2015 | Eroglu et al. |
| 2015/0168516 A1 | 6/2015 | Eberler et al. |
| 2015/0323623 A1 | 11/2015 | Adalsteinsson et al. |
| 2018/0156879 A1 * | 6/2018 | Findeklee .......... G01R 33/3692 |

* cited by examiner

TRANSMIT/RECEIVE RADIO FREQUENCY (RF) SYSTEM FOR A MAGNETIC RESONANCE EXAMINATION SYSTEM AND METHOD THEREOF

CROSS REFERENCE TO RELATED APPLICATIONS

This application is a U.S. national phase application of International Application No. PCT/EP2017/070889, filed on Aug. 17, 2017, which claims the benefit of PCT/CN2016/097295 filed on Aug. 30, 2016 and EP Application Serial No. 16196001.8 filed on Oct. 27, 2016 and is incorporated herein by reference.

FIELD OF THE INVENTION

The invention relates to a transmit/receive radio frequency system, and more particularly for use in a magnetic resonance examination system, as well as such a magnetic resonance examination system, a method and a computer program to be run on a magnetic resonance examination system.

BACKGROUND OF THE INVENTION

Magnetic resonance imaging (MRI) is often used for the examination and treatment of patients. By such a system, the nuclear spins of the body region to be examined are aligned by a static main magnetic field B0 and are excited by transverse magnetic fields B1 oscillating in the radio frequency band. In imaging, relaxation signals are exposed to gradient magnetic fields to localize the resultant resonance. The relaxation signals are received and reconstructed into a single or multi-dimensional image.

A magnetic resonance imaging system has a number of interacting components, each of which requires the use of modern and elaborate technologies. A central component of a magnetic resonance tomography system is the radio frequency device. This is responsible for the generation of the radio frequency pulses that are radiated into the body region to be imaged. The radio frequency pulses at the output of a radio frequency power amplifier of a magnetic resonance imaging system are conducted via a measurement tool to a transmission coil that radiates the radio frequency pulses into the body region. As used herein "transmission coil", means any antenna device with which the radio frequency pulses can be radiated.

The RF energy from a magnetic resonance imaging system may cause heating of the tissue of a body. One measure of RF absorption is the specific absorption rate (SAR), which specifies the deposited power per unit mass due to the RF pulse. The SAR value depends on the geometry of the part of the body that is exposed to the RF energy and the location and geometry of the RF source. Maximum values for SAR are specified by safety regulations. US2015/0002147 provides online monitoring of local SAR in parallel transmission systems. From the high frequency (HF) phase and the HF amplitude of the forward HF wave and the reflected HF wave measured by directional couplers, the local SAR in the patient may be determined with the aid of a voxel model of the patient and electromagnetic simulation. The online monitoring of local SAR aims to prevent a specific patient from excessive RF radiation, e.g., by shutting off the MRI scanner if the measured local SAR exceeds a predetermined threshold.

Superior to SAR monitoring, accurate measurements of the RF power delivered during clinical MRI are essential for safety and regulatory compliance, avoiding inappropriate restrictions on clinical MRI sequences, and for testing the MRI safety of peripheral and interventional devices at known RF exposure levels. Setting precise RF specific absorption rate (SAR) exposure levels for investigators testing devices or MRI methods, or for evaluating SAR in individual burn cases, requires accurate and independent measurement tools. This starts with accurate measurements of the total power deposition. The RF power monitors built into the MRI scanner are usually attached to the RF power amplifier output. However, measuring the power delivered to the body region is complicated by losses in the RF transmission chain, including the cables, switches, the quadrature-hybrid (Q-hybrid) and the transmission coil.

Currently, power meters in combination with directional couplers are used to measure forward power flowing from the RF power amplifier toward the MRI coil and reflected power reflected back to the RF power amplifier. The power measurement assumes that a forward coupled port PFWD of the directional coupler ideally outputs only a coupled signal that is proportional to the forward power and not affected at all by the reflected power. Likely, a reverse coupled port PREV of the directional coupler ideally outputs only a coupled signal that is proportional to the reflected power and not affected at all by the forward power. Thus, by measuring amplitudes of the coupled signals at the forward and reverse coupled ports PFWD and PREV, the forward power and reflected power travelling on the transmission chain can be determined, respectively, which is also referred to as a scalar method.

The scalar method based on such assumption implies uncertainty in power measurement, which depends upon a key parameter of the directional coupler, i.e. the directivity. Generally, by using a directional coupler with relatively high directivity, the measurement uncertainty is well controlled and the measurement outcome is still acceptable. However, directional couplers often have to compromise between directivity and power handling capability. The directional couplers with higher directivity but lower power handling capability are subject to more air breakdown risks. In addition, the directivities measured after on-field directional coupler installation generally have some degradation from the ones designed from computer installation. Therefore, a power measurement solution less dependent on the directivity of the directional coupler is desired. Furthermore, in the context of MRI applications with near magnet RF power amplifiers, larger reflection on the transmission chain makes the measurement uncertainty more severe.

SUMMARY OF THE INVENTION

From the foregoing, it is readily appreciated that there is a need for a more accurate power measurement with less dependency on the directivity of the directional coupler. It is consequently an object of the invention to provide the measurement method, a transmit/receive RF system implementing the measurement method, a magnetic resonance examination system, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa. The contents of the memory and storage may duplicate each other or items depicted as being in one may be stored or copied in the other.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. In accordance with the invention, a transmit/receive RF system for a magnetic resonance examination system is disclosed. The transmit/receive RF system comprises an RF antenna, an RF power amplifier configured to supply electrical RF power to the RF antenna, a coupling device coupled between the RF power amplifier and the RF antenna and configured to couple out a fraction of a reflected power flowing from the RF antenna toward the RF power amplifier and a fraction of a forward power flowing from the RF power amplifier toward the RF antenna to output a first coupled signal VREV and a second coupled signal VFWD, a wave detector coupled to the coupling device and configured to detect amplitude and phase information of the first coupled signal VREV and the second coupled signal VFWD, and a parameter calculator coupled to the wave detector and configured to calculate an operational parameter of the RF power amplifier based on complex scattering parameters of the coupling device and the detected amplitude and phase information of the first coupled signal VREV and second coupled signal VFWD.

By taking into account both the amplitude and phase information of the first coupled signal VREV and second coupled signal VFWD, the operational parameter of the RF power amplifier can be calculated in a more accurate and real time fashion based on the complex scattering parameters of the coupling device, the first coupled signal VREV and second coupled signal VFWD. Moreover, the measurement accuracy is less dependent on the directivity of the coupling device, and consequently the coupling device with more power handling capability, less demand on directivity, less requirement on manufacturing consistence and lower cost can be used in the transmit/receive RF system. More specifically, the parameter calculator is configured to calculate the operational parameter as a complex-valued function of the complex scattering parameters, the first coupled signal VREV, and the second coupled signal VFWD. Advantageously, a complex-valued function of the complex scattering parameters, the complex first coupled signal VREV, and the complex second coupled signal VFWD obtains the operational parameter in a complex plane, e.g., the Smith Chart, enabling the real-time measurement of the input impedance of the RF antenna and the coil current of RF antenna. Furthermore, the operational parameter in a complex value assists in phase control of the RF power amplifier, especially in case of large reflection.

In another embodiment of the present invention, the operation parameter of the RF power amplifier is any one of the group including the complex forward power, the complex reflected power, a complex reflection coefficient, a voltage standing wave ratio, a complex load impedance (resistance and reactance), a complex coil current and a return loss. The complex load impedance is important to the RF power amplifier, since it will assist in predicting the behavior of the power amplifier and making it stable and robust. The complex coil current is important in parallel transmitting system of MRI and is also a building block of RF current source.

In yet another embodiment of the present invention, the coupling device comprises a first port, a second port, a third port and a fourth port. The first port is coupled to the RF power amplifier and the second port is coupled to the RF antenna. The third port is configured to output the first coupled signal VREV comprising a first coupled-out fraction of the reflected power and a second coupled-out fraction of the forward power, and the fourth port is configured to output the second coupled signal VFWD comprising a third coupled-out fraction of the forward power and a fourth coupled-out fraction of the reflected power. Since both the first coupled signal VREV and the second coupled signal VFWD comprise a mixture of the forward power and reflected power, the root cause of measurement uncertainty in conventional power monitoring methods, i.e. assuming the first coupled signal VREV and the second coupled signal VFWD as pure signals proportional to the reflected power and the forward power respectively, is eliminated. Advantageously, the vector method according to the present invention discriminates different signal components in the mixed VREV and VFWD outputs from the coupling device by using both the magnitude and phase information of the complex first coupled signal VREV, and the complex second coupled signal VFWD and complex scattering parameters of the coupling device, resulting in a more accurate vector based measurement accordingly.

In yet another embodiment of the present invention, the complex scattering parameters of the coupling device are pre-detected complex values detected when the coupling device is in a standalone state. The coupling device in the standalone state provides the input/output ports readily accessible by a vector network analyzer, which is used for detection of the complex scattering parameters.

In yet another embodiment of the present invention, the complex scattering parameters are limited to a complex transmitting coefficient $S21$ representative of a complex ratio between an outward traveling voltage wave at the second port and an incident traveling voltage wave at the first port, a complex reflection coefficient $S22$ representative of a complex ratio between the outward traveling voltage wave at the second port and an incident traveling voltage wave at the second port, a complex coupling coefficient $S31$ representative of a complex ratio between an outward traveling voltage wave at the third port and the incident traveling voltage wave at the first port, a complex coupling coefficient $S32$ representative of a complex ratio between the outward travelling voltage wave at the third port and the incident travelling voltage wave at the second port, a complex coupling coefficient $S41$ representative of a complex ratio between an outward travelling voltage wave at the fourth port and the incident travelling voltage wave at the first port, and a complex coupling coefficient $S42$ representative of the complex ratio between the outward travelling voltage wave at the fourth port and the incident traveling voltage wave at the second port. Advantageously, the minimum number of complex scattering parameters is pre-detected for the vector based measurement of operational parameters.

In yet another embodiment of the present invention, the transmit/receive RF system, further comprises a storage unit coupled to the parameter calculator and configured to store the complex scattering parameters.

In accordance with the invention, a method for determining an operational parameter of an RF power amplifier in a transmit/receive RF system for a magnetic resonance examination system is disclosed. The method comprises the steps of receiving a first coupled signal VREV comprising a first coupled-out fraction of a reflected power flowing from the RF power amplifier toward an RF antenna and a second coupled-out fraction of the forward power flowing from the RF antenna toward the RF power amplifier via a coupling device coupled between the RF power amplifier and the RF antenna, receiving a second coupled signal VFWD comprising a third coupled-out fraction of the forward power and a fourth coupled-out fraction of the reflected power via the coupling device, and calculating the operational parameter of the RF power amplifier as a complex-valued function of complex scattering parameters of the coupling device, the first coupled signal VREV and the second coupled signal VFWD. Both the first coupled signal VREV and the second coupled signal VFWD are complex values containing amplitude and phase information.

In an embodiment of the present invention, the method further comprises detecting the phase and amplitude information of the first coupled signal VREV and the second coupled signal VFWD.

In another embodiment of the present invention, the method further comprises predetecting the complex scattering parameters of the coupling device when the coupling device is in a standalone state.

In another embodiment of the present invention, the method further comprises storing the complex scattering parameters of the coupling device in a storage unit in the transmit/receive radio RF system.

The method of the invention can be advantageously carried out on magnetic resonance examination devices in clinical use. To this end, it is merely necessary to utilize a computer program by which the magnetic resonance examination device is controlled such that it performs the above-explained method steps of the invention. The computer program may be present either on a data carrier or be present in a data network so as to be downloaded for installation in the control unit of the magnetic resonance examination device.

BRIEF DESCRIPTION OF THE DRAWINGS

The enclosed drawings disclose preferred embodiments of the invention. It should be understood, however, that the drawings are designed for the purpose of illustration only and not as a definition of the limits of the invention. In the drawings:

FIG. 3 includes FIG. 3(*a*) illustrating a comparison between the vector based measurement and vector network analyzer (VNA) measurement of the same reflection on the complex plane, and FIG. 3(*b*) illustrating a comparison between the vector based measurement and scalar measurement;

DETAILED DESCRIPTION OF THE EMBODIMENTS

Figure 1:
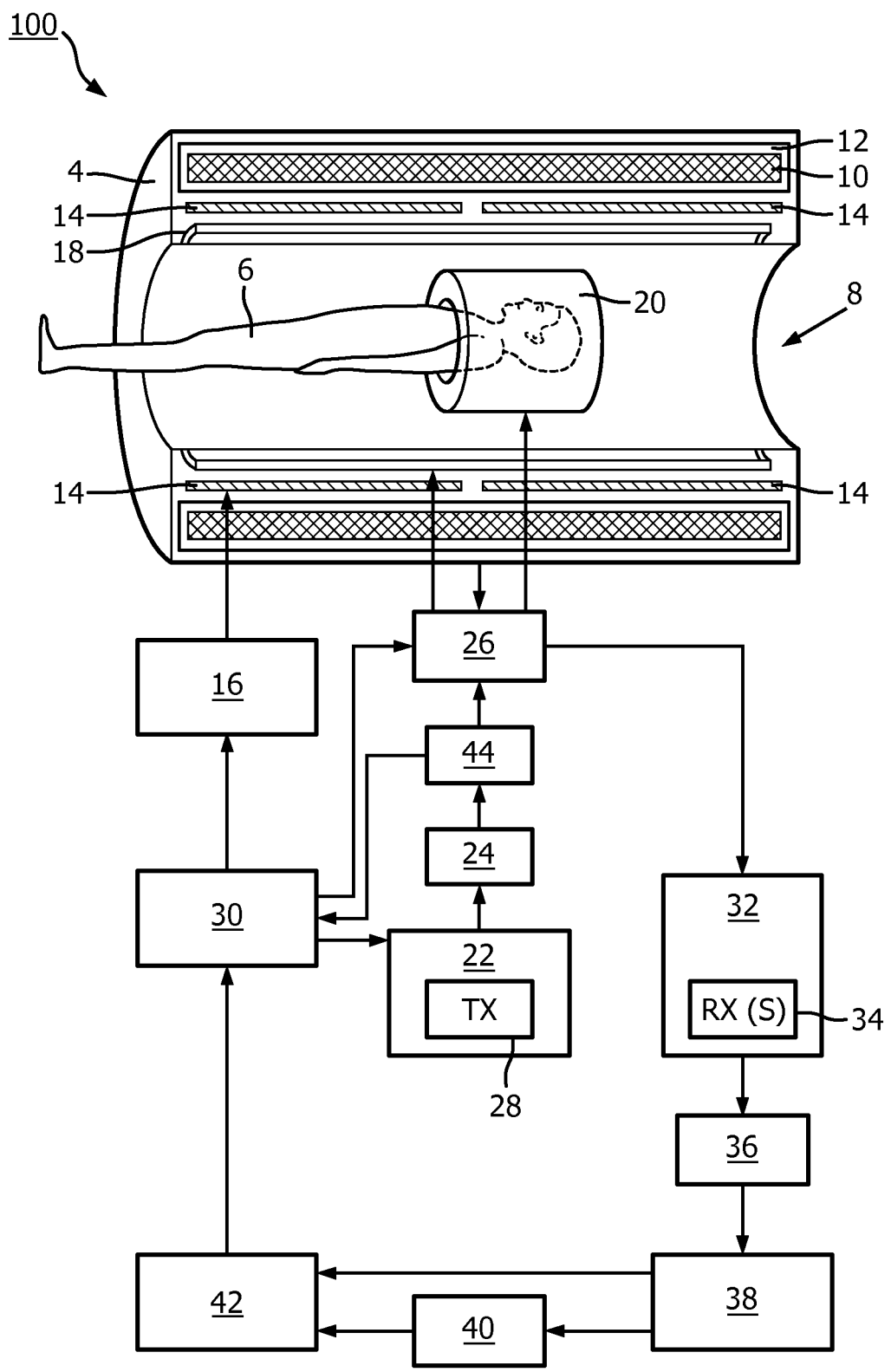
FIG. 1 shows a magnetic resonance imaging (MRI) system according to one embodiment of the present invention.

With reference to FIG. 1, a magnetic resonance imaging system 100 includes a housing 4. A subject 6 (e.g., a human, an object, etc.) is at least partially disposed within a bore 8 of the housing 4 for one or more MRI procedures (e.g., spin echo, gradient echo, stimulated echo, etc.). A magnet 10 resides in the housing 4. The magnet 10 typically is a persistent superconducting magnet surrounded by a cryo shrouding 12. However, other known magnets (e.g., a resistive magnet, a permanent magnet, etc.) can be employed. The magnet 10 produces a stationary and substantially homogeneous main magnetic field B0 in the subject 6. As a result, the nuclei within the subject 6 preferentially align in a parallel and/or an anti-parallel direction with respect to the magnetic flux lines of the magnetic field B0. Typical magnetic field strengths are about 0.5 Tesla (0.5 T), 1.0 T, 1.5 T, 3 T or higher (e.g., about 7 T).

Magnetic field gradient coils 14 are arranged in and/or on the housing 4. The coils 14 superimpose various magnetic field gradients G on the magnetic field B0 in order to define an imaging slice or volume and to otherwise spatially encode excited nuclei. Image data signals are produced by switching gradient fields in a controlled sequence by a gradient controller 16. One or more radio frequency (RF) coils or resonators are used for excitation pulses within an imaging region. Suitable RF coils include a full body coil 18 located in the bore 8 of the system 100, a local coil (e.g., a head coil 20 surrounding a head of the subject 6), and/or one or more surface coils.

An excitation source 22 generates the excitation pulses and provides these pulses to the RF coils 18 and/or 20 through a RF amplifier 24 and a switch 26. The excitation source 22 includes at least one transmitter (TX) 28. A measurement device 44 is coupled to the output of the RF amplifier 24 to measure the forward power and reflected power travelling on the transmission chain. Advantageously, the measurement device 44 can provide a more accurate forward and reflected power measurement result, which is further sent to a scanner controller 30 for excitation pulse adjustment. The scanner controller 30 controls the excitation source 22 based on operator instructions. For instance, if an operator selects a protocol for acquisition of proton spectra, the scanner controller 30 accordingly instructs the excitation source 22 to generate excitation pulses at a corresponding frequency, and the transmitter 28 generates and transmits the pulses to the RF coils 18 or 20 via the amplifier 24. The excitation pulses are fed to the RF amplifier 24. Conventional MRI systems typically utilize multiple amplifiers, in case more than one excitation spectra is used.

The excitation pulses are sent from the amplifier 24 to the coils 18 or 20 through the switch 26. The scanner controller 30 also controls the switch 26. During an excitation phase, the scanner controller 30 controls the switch 26 and allows the excitation pulses to pass through the switch 26 to the RF coils 18 or 20, but not to a receive system 32. Upon receiving excitation pulses, the RF coils 18 or 20 resonate and apply the pulses into the imaging region. The gradient controller 16 suitably operates the gradient coils 14 to spatially encode the resulting MR signals.

During the readout phase, the switch 26 connects the receive system 32 to one or more receive coils to acquire the spatially encoded MR signals. The receive system 32 includes one or more receivers 34 depending on the receive coil configuration. The acquired MR signals are conveyed (serially and/or in parallel) through a data pipeline 36 and processed by a processing component 38 to produce one or more images.

The reconstructed images are stored in a storage component 40 and/or displayed on an interface 42, other display device, printed, communicated over a network (e.g., the Internet, a local area network (LAN) . . . ), stored within a storage medium, and/or otherwise used. The interface 42 also allows an operator to control the magnetic resonance imaging scanner 100 through conveying instructions to the scanner controller 30.

Figure 2:
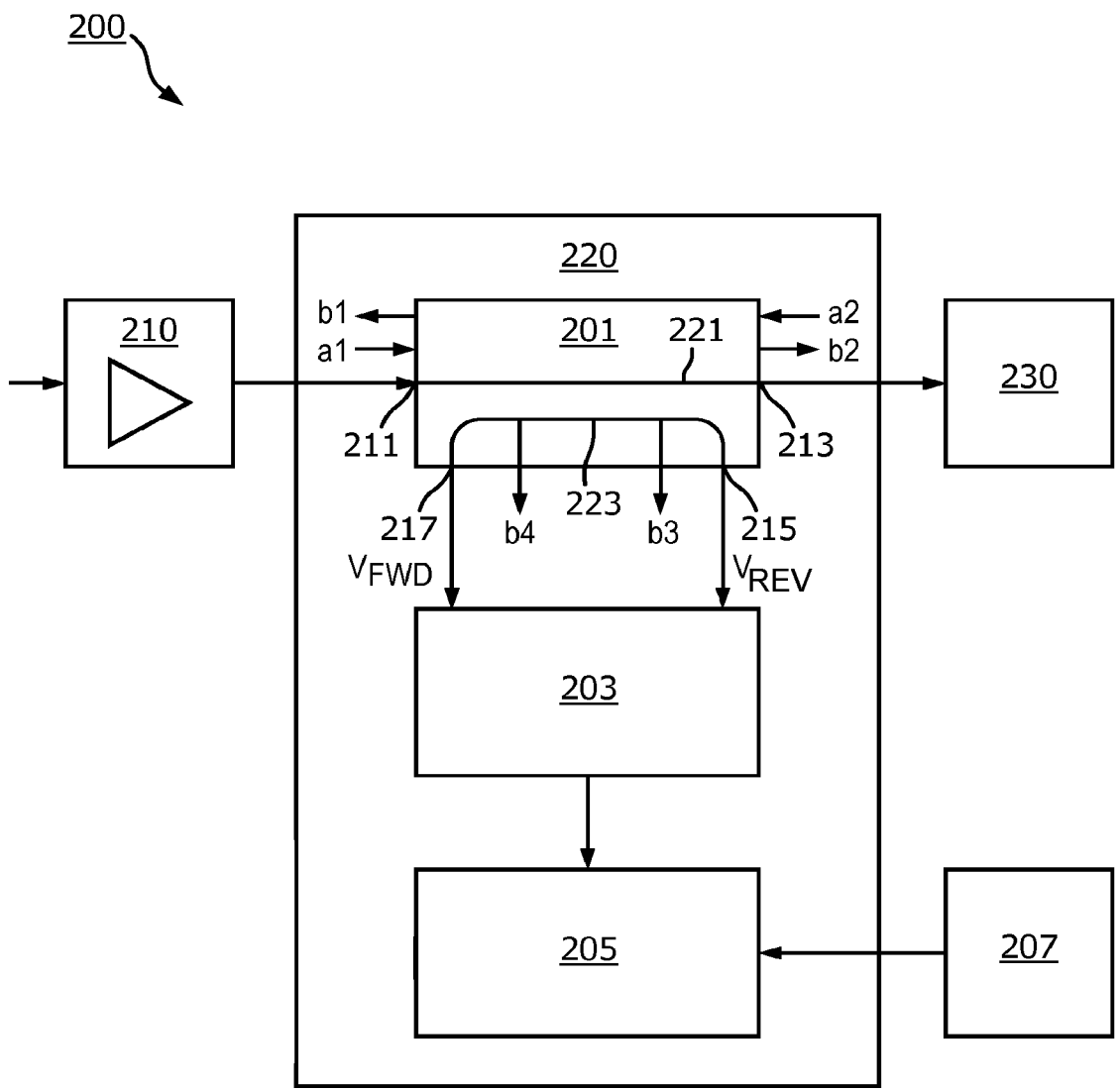
FIG. 2 shows a transmit/receive RF system according to one embodiment of the present invention.

FIG. 2 illustrates a block diagram of a transmit/receive RF system 200 according to one embodiment of the present invention. The transmit/receive RF system 200 includes a RF power amplifier 210, a measurement device 220 and a RF antenna 230. In one embodiment, the measurement device 220 further includes a coupling device 201, a wave detector 203 and a parameter calculator 205. Optionally, the measurement device 220 can also include a memory unit 207. In the embodiment of FIG. 2, the coupling device 201 is in the form of a four port directional coupler including a transmission line 221 connecting a first (input) port 211 and a second (output) port 213 and a coupling line 223 connecting a third (reverse coupled) port PREV 215 and a fourth (forward coupled) port PFWD 217. The input port 211 of the directional coupler 201 is connected to the output of the RF power amplifier 210 and the output port 213 is connected to the RF antenna 230, e.g., the surface coil or local coils.

A directivity (D) of the directional coupler 201 is a measure of how well the directional coupler 201 distinguishes the opposite travelling (forward and reflected) signals on the transmission line 221. Ideally, the reverse coupled port PREV 215 outputs only a coupled signal proportional to the reflected power (scaled version of the reflected power) and the forward coupled port PFWD 217 outputs only a coupled signal proportional to the forward power (scaled version of the forward power). While, in practice, the reverse and forward coupled port PREV and PFWD 215 and 217 of the directional coupler 201 actually output a mixture of the reflected power and forward power. More specifically, the reverse coupled port PREV 215 outputs a first coupled signal VREV comprising a first scaled fraction of forward power flowing from the input port 211 to the output port 213 and a second scaled fraction of reflected power flowing from the output port 213 to the input port 211, and the forward coupled port PFWD 217 outputs a second coupled signal VFWD comprising a third scaled fraction of forward power flowing from the input port 211 to the output port 213 and a fourth scaled fraction of reflected power flowing from the output port 213 to the input port 211.

As power travelling between any two ports of the directional coupler 201 may be described using complex scattering parameters (S-parameters) defined in terms of incident and outward travelling voltage waves (a and b) at the input port 211, the output port 213, the reverse coupled port PREV 215 and the forward coupled port PFWD 217 of the directional coupler 201, an insight of the present invention is that the operational parameters of the RF power amplifier 201 can be measured by the measurement device 220 in a more accurate way via a vector computation based on complex scattering parameters and complex coupled signals VREV and VFWD containing both amplitude and phase information. The insight of the present invention is based on the discovery of the inventor that assuming the first coupled signal VREV and the second coupled signal VFWD as pure signals proportional to the reflected power and the forward power respectively is the root cause of measurement uncertainty in conventional power monitoring methods. By taking into account both the amplitude and phase information, different signal components in the mixed VREV and VFWD outputs from the coupling device 201 can be discriminated, and hence the measurement uncertainty can be reduced significantly. Moreover, as the result of the vector based measurement can be displayed on the complex plane, e.g., the Smith Chart, the functionality of the measurement device 220 in accordance with the present invention can be extended beyond the capability of conventional power monitoring methods to complex domain of measurement. For example, the vector based measurement enables the measurement of the input impedance of the body coil Zcoil and the coil current Icoil. The input impedance of the body coil Zcoil is important to the RF power amplifier 210, since it will assist in predicting the behavior of the power amplifier and making it stable and robust. The coil current estimation Icoil is important in parallel transmitting system of MRI and is also a building block of RF current source. Furthermore, the vector based measurement excels in phase control of the RF power amplifier, especially in case of large reflection. In addition to above mentioned benefits, the vector based measurement is less dependent on the directivity D of the directional coupler, which brings more flexibility in the design of power handling capability.

In one embodiment, a vector network analyzer (not shown) can measure scattering parameters of the directional coupler 201 in a standalone state, e.g., in advance of its implementation in the transmit/receive RF system 200. In the example of FIG. 2, the scattering parameters of the directional coupler 201 are pre-detected values detected when the directional coupler 201 is in the standalone state, and stored in the memory unit 207 for measuring the operational parameters of the RF power amplifier 210 in real time. Alternatively, the pre-detected scattering parameters can be provided to an input interface of the parameter calculator 205 directly. Advantageously, the directional coupler 201 in the standalone state facilitates its connection to the vector network analyzer since its input/output ports are readily accessible. For on-board directional couplers, e.g., implemented in the transmit/receive RF systems already, the first (input) port 211 has been connected to the output of the RF amplifier 210 electrically and therefore becomes not readily accessible by the vector network analyzer. In this instance, the first port 211 can be disconnected from the output of the RF amplifier 210 temporarily until the pre-detection of the scattering parameters by the vector network analyzer completes. Furthermore, the directional coupling devices are generally made of endurable materials, e.g., fiber glass in FR4 or Rogers substrate in the form of simple circuit layouts, resulting in a passive device with complex scattering parameters insensitive to large signal variations within the specified operational range. Consequently, the scattering parameters pre-detected during the standalone state of the coupling device are applicable in the real-time vector based measurement.

As above-mentioned, the vector based measurement calls for the first and second coupled signals VREV and VFWD containing both the amplitude and phase information. To the end, the first and second coupled signals VREV and VFWD are directed to the wave detector 203. The wave detector 203 converts the magnitude and phase information of the first and second coupled signals VREV and VFWD to DC voltages. Alternatively, the wave detector 203 converts the magnitude and phase information of the first and second coupled signals VREV and VFWD to sampled values in a digital fashion based on the principle of software-defined radio (SWR). The parameter calculator 205 calculates the operational parameters of the RF power amplifier 210 based on the DC voltages or sampled digital values representative of magnitude and phase information of the first and second coupled signals VREV and VFWD and the complex scattering parameters.

Advantageously, in addition to complex forward power PFWD, complex reflected power PREV, complex reflection coefficient r, voltage standing wave ratio VSWR and return loss RL, the vector based measurement also enables the measurement of the complex input impedance of the load coil Zcoil and the load coil current Icoil that the conventional scalar measurement is not able to measure. In one embodiment, these operational parameters are calculated by the parameter calculator 205 according to vector based computation as detailed in equations 1) to 7), respectively, which have been tested and verified through lots of experiments.

$$P_{FWD} = \left| \frac{(S_{22}S_{41} - S_{21}S_{42})b_3 + (S_{21}S_{32} - S_{22}S_{31})b_4}{S_{32}S_{41} - S_{31}S_{42}} \right| \cdot \tag{1}$$

$$\frac{(S_{22}S_{41} - S_{21}S_{42})b_3 + (S_{21}S_{32} - S_{22}S_{31})b_4}{S_{32}S_{41} - S_{31}S_{42}} \cdot \frac{1}{2 \cdot 50\Omega}$$

$$P_{REV} = \left| \frac{S_{41}b_3 - S_{31}b_4}{S_{32}S_{41} - S_{31}S_{42}} \right| \cdot \left| \frac{S_{41}b_3 - S_{31}b_4}{S_{32}S_{41} - S_{31}S_{42}} \right| \cdot \frac{1}{2 \cdot 50\Omega} \tag{2}$$

$$\Gamma_{Coil} = \frac{S_{41}\frac{b_3}{b_4} - S_{31}}{(S_{22}S_{41} - S_{21}S_{42})\frac{b_3}{b_4} + (S_{21}S_{32} - S_{22}S_{31})} \tag{3}$$

$$VSWR = \frac{1 + \frac{\left| S_{41}\frac{b_3}{b_4} - S_{31} \right|}{\left| (S_{22}S_{41} - S_{21}S_{42})\frac{b_3}{b_4} + (S_{21}S_{32} - S_{22}S_{31}) \right|}}{1 - \frac{\left| S_{41}\frac{b_3}{b_4} - S_{31} \right|}{\left| (S_{22}S_{41} - S_{21}S_{42})\frac{b_3}{b_4} + (S_{21}S_{32} - S_{22}S_{31}) \right|}} \tag{4}$$

$$RL = 20\log_{10} \frac{\left| S_{41}\frac{b_3}{b_4} - S_{31} \right|}{\left| (S_{22}S_{41} - S_{21}S_{42})\frac{b_3}{b_4} + (S_{21}S_{32} - S_{22}S_{31}) \right|} \tag{5}$$

$$Z_{coil} = Z_0 \frac{1 + \frac{S_{41}\frac{b_3}{b_4} - S_{31}}{(S_{22}S_{41} - S_{21}S_{42})\frac{b_3}{b_4} + (S_{21}S_{32} - S_{22}S_{31})}}{1 - \frac{S_{41}\frac{b_3}{b_4} - S_{31}}{(S_{22}S_{41} - S_{21}S_{42})\frac{b_3}{b_4} + (S_{21}S_{32} - S_{22}S_{31})}} \tag{6}$$

$$I_{coil} = \left( \frac{1}{Z_{rlc} \left\| \frac{1}{j\omega C_M} \right.} - j\omega C_M \right) \cdot \tag{7}$$

$$\frac{(S_{22}S_{41} - S_{21}S_{42} + S_{41})b_3 + (S_{21}S_{32} - S_{22}S_{31} - S_{31})b_4}{S_{32}S_{41} - S_{31}S_{42}}$$

where b3 represents the outward travelling voltage wave at the third port, i.e. the first coupled signal VREV, b4 represents the outward travelling voltage wave at the fourth port, i.e. the second coupled signal VFWD, Sij represents a complex ratio between an outward traveling voltage wave at the ith port and an incident traveling voltage wave at the jth port, Z0 represents a characteristic impedance of the RF power amplifier 210, Zrlc represents a loop impedance without a shunt matching capacitor in a transmit array of the RF antenna 230, and CM stands for the shunt matching capacitor.

According to equations 1) to 7), it can be concluded that it is not necessary to detect all the 16 scattering parameters of the four port directional coupler 201 in advance. Advantageously, the pre-detected scattering parameters of the four port directional coupler 201 can be limited to a complex transmitting coefficient S21 representative of the complex ratio between the outward traveling voltage wave b2 at the second (output) port and the incident traveling voltage wave a1 at the first (input) port, a complex reflection coefficient S22 representative of the complex ratio between the outward traveling voltage wave b2 at the second (output) port and the incident traveling voltage wave a2 at the second (output) port, a complex coupling coefficient S31 representative of the complex ratio between the outward traveling voltage wave b3 at the third (reverse) port and the incident traveling voltage wave a1 at the first (input) port, a complex coupling coefficient S32 representative of the complex ratio between the outward travelling voltage wave b3 at the third port and the incident travelling voltage wave a2 at the second port, a complex coupling coefficient S41 representative of the complex ratio between the outward travelling voltage wave b4 at the fourth port and the incident travelling voltage wave a1 at the first port, and a complex coupling coefficient S42 representative of the complex ratio between the outward travelling voltage wave b4 at the fourth port and the incident traveling voltage wave a2 at the second port.

As will be appreciated by one skilled in the art, the parameter calculator 205 may take the form of an entirely hardware embodiment (including FPGA, ASCII, MPU, etc.), an entirely software embodiment (including firmware, resident software, micro-code, etc.) or an embodiment combing software and hardware aspects that may all generally be referred to herein as a "circuit," "module" or "system." Furthermore, aspects of the present invention may take the form of a computer program product embodied in one or more computer readable medium(s) having computer readable program code embodied thereon.

Figures 3A, 3B:
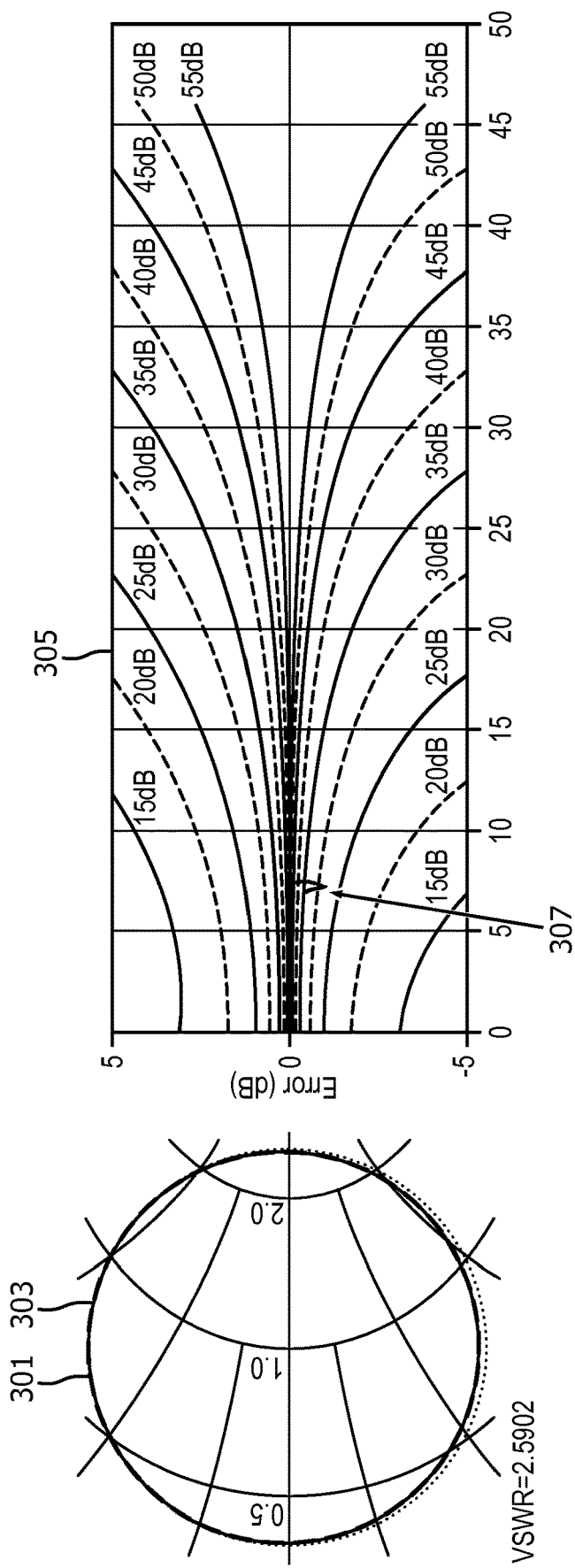
FIG. 3 shows an exemplary experiment result of vector based measurement of the complex reflection coefficient and the related return loss.

FIG. 3 illustrates an exemplary experiment result of vector based measurement of the complex reflection coefficient and the related return loss. More specifically, the left FIG. 3(a) illustrates a comparison between the vector based measurement and vector network analyzer (VNA) measurement of the same reflection on the complex plane, e.g., the Smith Chart. The VNA measurement measures the reflection of a mismatched load plus a long cable, and is regarded as the baseline to verify the vector based measurement. As illustrated in FIG. 3(a), the vector based measurement result, designated by the dashed curve 301, follows the VNA measurement, designated by the solid curve 303, closely except for some adjustable phase rotation. The comparison result shown in FIG. 3(a) indicates that the vector based method provides an accurate measurement over various phases.

FIG. 3(b) illustrates a comparison between the vector based measurement and scalar measurement, by projecting the vector based measurement result to the scalar representation 305. The horizontal axis of the scalar representation 305 stands for the to-be-measured strength of reflection in terms of return loss. The vertical axis of the scalar representation 305 represents the deviation of measured value in the unit of dB. The center horizontal line of the scalar representation 305 has 0 dB deviation for all reflection, i.e. no measurement error. Every pair of curves above and beneath the center horizontal line outline the upper and lower bounds of measurement outputs at a certain applied directivity value of the directional coupler. For example, if a reflection of 10 dB, in terms of return loss, is measured by the scalar method with a directivity of 20 dB in its directional coupler, the measurement output could be any value ranging from 6.5 dB to 12.6 dB, also in terms of return loss, depending upon the specific phase value of such a 10 dB reflection. Therefore, the uncertainty in this measurement is [10 dB−3.5 dB, 10 dB+2.6 dB]. Such an uncertainty may bring false fault and operation risk to the RF power amplifier of MRI application. As suggested by the scalar representation 305, the return loss uncertainty can be reduced if the directional coupler is replaced by a better one with a higher directivity. However, the directivity of a directional coupler cannot be increased too much due to limitations in manufacturing and applications. Advantageously, the vector based method can achieve a much more accurate measurement on the reflection of 7.3 dB return loss, i.e. VSWR~=2.52, with almost all phase angles, resulting in a range of [7.3 dB-0.9 dB, 7.3 dB-0.2 dB], based on a directional coupler with only 15 dB of directivity. Also shown in FIG. 3(b), the trace 307 pointed by the arrow represents the vector based measurement on almost all phase reflection of 7.3 dB return loss, based on the directional coupler of 15 dB directivity. The vector based measurement with a coupling device of 15 dB in directivity, in this example (all-phase 7.3 dB reflection), falls into the uncertainty range of [7.3 dB-0.9 dB, 7.3 dB-0.2 dB], which can only be achieved by a coupling device of greater than 25 dB directivity via the conventional scalar method.

Figure 4:
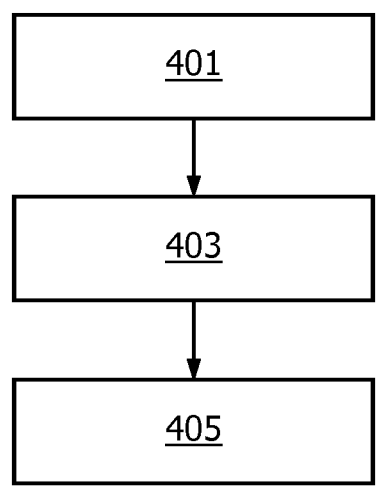
FIG. 4 shows a flow chart of a method for determining an operational parameter of an RF power amplifier in a transmit/receive RF system for a magnetic resonance examination system according to one embodiment of the present invention.

FIG. 4 illustrates a flowchart 400 for determining an operational parameter of an RF power amplifier in a transmit/receive RF system for a magnetic resonance examination system according to one embodiment of the present invention. At step 401, a first coupled signal VREV comprising a first desirable coupled-out fraction of a reflected power flowing from a RF power amplifier toward an RF antenna and a first undesirable coupled-out fraction of a forward power flowing from the RF antenna toward the RF power amplifier is generated via a coupling device. The first coupled signal VREV is a first complex value containing amplitude and phase information. At step 403, a second coupled signal VFWD comprising a second desirable coupled-out fraction of the forward power and a second undesirable coupled-out fraction of the reflected power via the coupling device. The second coupled signal VFWD is a second complex value containing amplitude and phase information. At step 405, the operational parameter of the RF power amplifier is calculated as a complex-valued function of complex scattering parameters of the coupling device, the first coupled signal VREV and the second coupled signal VFWD.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments described above are illustrative examples and it should not be construed that the present invention is limited to these particular embodiments. Thus, various changes and modifications may be effected by one skilled in the art without departing from the spirit or scope of the invention as defined in the appended claims.

The invention claimed is:

1. A transmit/receive radio frequency (RF) system for a magnetic resonance examination system comprising:

an RF antenna;

an RF power amplifier configured to supply electrical RF power to the RF antenna;

a coupling device coupled between the RF power amplifier and the RF antenna and configured to couple out fractions of a reflected power flowing from the RF antenna toward the RF power amplifier and a forward power flowing from the RF power amplifier toward the RF antenna to output a first coupled signal $V_{REV}$ comprising a first coupled-out fraction of a reflected power flowing from the RF power amplifier toward an RF antenna and a second coupled-out fraction of the forward power flowing from the RF antenna toward the RF power amplifier, and a second coupled signal $V_{FWD}$ comprising a third coupled-out fraction of the forward power and a fourth coupled-out fraction of the reflected power via the coupling device, wherein the second coupled signal VFWD is a second complex value containing amplitude and phase information;

a wave detector coupled to the coupling device and configured to detect amplitude and phase information of the first coupled signal $V_{REV}$ and the second coupled signal $V_{FWD}$; and a parameter calculator coupled to the wave detector and configured to calculate an operational parameter of the RF power amplifier based on complex scattering parameters of the coupling device and the detected amplitude and phase information of the first coupled signal $V_{REV}$ and second coupled signal $V_{FWD}$.

2. The transmit/receive RF system of claim 1, wherein the operational parameter of the RF power amplifier is any one of a group including the forward power, the reflected power, a complex reflection factor, a voltage standing wave ratio, a complex load impedance, a complex coil current and a return loss.

3. The transmit/receive RF system of claim 1, wherein the coupling device comprises a first port, a second port, a third port and a fourth port, the first port coupled to the RF power amplifier and the second port coupled to the RF antenna, the third port configured to output the first coupled signal $V_{REV}$ comprising the first coupled-out fraction of the reflected power and the second coupled-out fraction of the forward power, and the fourth port configured to output the second coupled signal $V_{FWD}$ comprising the third coupled-out fraction of the forward power and the fourth coupled-out fraction of the reflected power.

4. The transmit/receive RF system of claim 1, wherein the complex scattering parameters of the coupling device are pre-detected values detected when the coupling device is in a standalone state.

5. The transmit/receive RF system of claim 3, wherein the complex scattering parameters are limited to a complex transmitting coefficient $S_{21}$ representative of a complex ratio between an outward traveling voltage wave at the second port and an incident traveling voltage wave at the first port, a complex reflection coefficient $S_{22}$ representative of a complex ratio between the outward traveling voltage wave at the second port and an incident traveling voltage wave at the second port, a complex coupling coefficient $S_{31}$ representative of a complex ratio between an outward traveling voltage wave at the third port and the incident traveling voltage wave at the first port, a complex coupling coefficient $S_{32}$ representative of a complex ratio between the outward travelling voltage wave at the third port and the incident travelling voltage wave at the second port, a complex coupling coefficient $S_{41}$ representative of a complex ratio between an outward travelling voltage wave at the fourth port and the incident travelling voltage wave at the first port, and a complex coupling coefficient $S_{42}$ representative of the complex ratio between the outward travelling voltage wave at the fourth port and the incident traveling voltage wave at the second port.

6. The transmit/receive RF system of claim 1, further comprising: a storage unit coupled to the parameter calculator and configured to store the complex scattering parameters.

7. A method for determining an operational parameter of an RF power amplifier in a transmit/receive radio frequency (RF) system for a magnetic resonance examination system, the method comprising:
receiving a first coupled signal $V_{REV}$ comprising a first coupled-out fraction of a reflected power flowing from the RF power amplifier toward an RF antenna and a second coupled-out fraction of a forward power flowing from the RF antenna toward the RF power amplifier via a coupling device coupled between the RF power amplifier and the RF antenna, wherein the first coupled signal $V_{REV}$ is a first complex value containing amplitude and phase information;
receiving a second coupled signal $V_{FWD}$ comprising a third coupled-out fraction of the forward power and a fourth coupled-out fraction of the reflected power via the coupling device, wherein the second coupled signal $V_{FWD}$ is a second complex value containing amplitude and phase information; and
calculating the operational parameter of the RF power amplifier as a complex-valued function of complex scattering parameters of the coupling device, the first coupled signal $V_{REV}$ and the second coupled signal $V_{FWD}$.

8. The method claim 7, further comprising: detecting the phase and amplitude information of the first coupled signal $V_{REV}$ and the second coupled signal $V_{FWD}$.

9. The method of claim 7, further comprising:
predetecting the complex scattering parameters of the coupling device when the coupling device is in a standalone state.

10. The method of claim 7, wherein the complex scattering parameters are limited to a complex transmitting coefficient $S_{21}$ representative of a complex ratio between an outward traveling voltage wave at a second port and an incident traveling voltage wave at first port, a complex reflection coefficient $S_{22}$ representative of a complex ratio between the outward traveling voltage wave at the second port and an incident traveling voltage wave at the second port, a complex coupling coefficient $S_{31}$ representative of a complex ratio between an outward traveling voltage wave at a third port and the incident traveling voltage wave at the first port, a complex coupling coefficient $S_{32}$ representative of a complex ratio between the outward travelling voltage wave at the third port and the incident travelling voltage wave at the second port, a complex coupling coefficient $S_{41}$ representative of a complex ratio between an outward travelling voltage wave at fourth port and the incident travelling voltage wave at the first port, and a complex coupling coefficient $S_{42}$ representative of the complex ratio between the outward travelling voltage wave at the fourth port and the incident traveling voltage wave at the second port.

11. The method of claim 7, further comprising: storing the complex scattering parameter of the coupling device in a storage unit in the transmit/receive radio RF system.

12. The method of claim 7, wherein the operation parameter of the RF power amplifier is any one of a group comprising the forward power, the reflected power, a complex reflection factor, a voltage standing wave ratio, a complex load impedance, a complex coil current and a return loss.

13. A magnetic resonance examination system comprising the transmit/receive RF system as set forth in claim 1.

14. A computer program product stored on a non-transitory computer-readable medium comprising software code, which when executed by a processor causes the processor to:
receive a first coupled signal $V_{REV}$ comprising a first coupled-out fraction of a reflected power flowing from an RF power amplifier toward an RF antenna and a second coupled-out fraction of a forward power flowing from the RF antenna toward the RF power amplifier via a coupling device coupled between the RF power amplifier and the RF antenna, wherein the first coupled signal $V_{REV}$ is a first complex value containing amplitude and phase information;
receive a second coupled signal $V_{FWD}$ comprising a third coupled-out fraction of the forward power and a fourth coupled-out fraction of the reflected power via the coupling device, wherein the second coupled signal $V_{FWD}$ is a second complex value containing amplitude and phase information; and
calculate an operational parameter of the RF power amplifier as a complex-valued function of complex scattering parameters of the coupling device, the first coupled signal $V_{REV}$ and the second coupled signal $V_{FWD}$.

15. The computer program product of claim 14, wherein the non-transitory computer-readable medium further comprises software code, which when executed by the processor, further causes the processor to detect the phase and amplitude information of the first coupled signal $V_{REV}$ and the second coupled signal $V_{FWD}$.

16. The computer program product of claim 14, wherein the non-transitory computer-readable medium further comprises software code, which when executed by the processor, further causes the processor to predetect the complex scattering parameters of the coupling device when the coupling device is in a standalone state.

17. The computer program product of claim 14, wherein the complex scattering parameters are limited to a complex transmitting coefficient $S_{21}$ representative of a complex ratio between an outward traveling voltage wave at a second port and an incident traveling voltage wave at a first port, a complex reflection coefficient $S_{22}$ representative of a complex ratio between the outward traveling voltage wave at the second port and an incident traveling voltage wave at the second port, a complex coupling coefficient $S_{31}$ representative of a complex ratio between an outward traveling voltage wave at a third port and the incident traveling voltage wave at the first port, a complex coupling coefficient $S_{32}$ representative of a complex ratio between the outward travelling voltage wave at the third port and the incident travelling voltage wave at the second port, a complex coupling coefficient $S_{41}$ representative of a complex ratio between an outward travelling voltage wave at a fourth port and the incident travelling voltage wave at the first port, and a complex coupling coefficient $S_{42}$ representative of the complex ratio between the outward travelling voltage wave at the fourth port and the incident traveling voltage wave at the second port.

18. The computer program product of claim 14, wherein the non-transitory computer-readable medium further comprises software code, which when executed by the processor, further causes the processor to store the complex scattering parameter of the coupling device in a storage unit in a transmit/receive radio RF system.

19. The computer program product of claim 14, wherein the operation parameter of the RF power amplifier is any one of a group comprising a forward power, the reflected power, a complex reflection factor, a voltage standing wave ratio, a complex load impedance, a complex coil current and a return loss.

* * * * *